(12) United States Patent
Sachan et al.

(10) Patent No.: US 7,170,769 B1
(45) Date of Patent: Jan. 30, 2007

(54) HIGH PERFORMANCE AND REDUCED AREA ARCHITECTURE FOR A FULLY PARALLEL SEARCH OF A TCAM CELL

(75) Inventors: Rashmi Sachan, Karnataka (IN); Santhosh Narayanaswamy, Karnataka (IN); Bryan D Sheffield, McKinney, TX (US); George Jamison, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/242,183

(22) Filed: Oct. 3, 2005

(51) Int. Cl.
   *G11C 15/00* (2006.01)
(52) U.S. Cl. .................................. 365/49; 365/168
(58) Field of Classification Search .................. 365/49, 365/168, 63, 129
   See application file for complete search history.

(56) References Cited

U.S. PATENT DOCUMENTS 6,678,184 B2 * 1/2004 Lysinger et al. .............. 365/49
6,807,077 B2 * 10/2004 Noda et al. .................... 365/49
6,900,999 B1 * 5/2005 Yen et al. ...................... 365/49
7,110,275 B2 * 9/2006 Park .............................. 365/49

* cited by examiner

Primary Examiner—Anh Phung
(74) Attorney, Agent, or Firm—Alan K. Stewart; W. James Brady; Frederick J. Telecky, Jr.

(57) ABSTRACT

A technique to enhance performance and reduce silicon area for a TCAM system which includes a plurality of CAM blocks that are organized into at least one rectangular array having rows each having a plurality of CAM blocks, a group of TCAM cells and associated read/write bit lines connecting the group of CAM cells to search bit lines. Each TCAM cell in the TCAM architecture includes a pair of memory elements that is connected to a pair of associated compare circuits such that the interconnections between the memory elements and the compare circuits are substantially vertical in active MOS layers and substantially horizontal in the metal layers to facilitate sharing of adjacent cells thereby providing reduced silicon area and a short aspect ratio.

12 Claims, 8 Drawing Sheets

HIGH PERFORMANCE AND REDUCED AREA ARCHITECTURE FOR A FULLY PARALLEL SEARCH OF A TCAM CELL

TECHNICAL FIELD OF THE INVENTION

The present invention relates generally to digital integrated circuits, and more particularly relates to content addressable memories (CAMs).

BACKGROUND OF THE INVENTION

Content Addressable Memories (CAMs) are commonly used in cache systems, and other address translation systems, of high speed computing systems. They are also useful in high-speed network routers, and many other applications known in the art of computing.

Each CAM typically has a CAM block array that includes a plurality of rows, each row has multiple CAM blocks and each CAM block has a plurality of CAM cells. The CAM cells are characterized by circuitry capable of generating a match output for each row of CAM blocks in the CAM block array thereby indicating whether any location of the array contains a data pattern that matches a query input and the identity of that location. Each CAM cell typically has the ability to store a unit of data, and the ability to compare that unit of data with a unit of a query input. Each CAM block has the ability to generate a match output. A compare result indication of each CAM block in a row is combined to produce a match signal for the row to indicate whether the row of CAM cells contains a stored word matching a query input. The match signals from each row in the CAM block array together constitute match output signals of the array; these signals may be encoded to generate the addresses of matched locations or used to select data from rows of additional memory.

Each CAM cell in each column is typically connected to a common read/write bit line and a search bit line. The common read/write bit line is used to write the data to a pair of memory cells, which can be part of a ternary CAM (TCAM) cell or a single memory cell, such as a binary CAM. Each memory cell is accessed using a word line which is decoded using an input address. The common read/write bit line is also used for reading the data from a memory cell. The differential developed across the read/write bit lines are sensed using a sense amplifier during a read cycle.

Further, each CAM cell in each column is typically connected to a common query data line, also referred to as a common search data line. The common search data line enables simultaneous data searching in each CAM cell in a column from a query input. The common search data line can also be used as a write data line, when the CAM cell is based on a PMOS compare circuit.

The unit of data that is stored in a CAM cell is often binary, having two possible states: logic one, and logic zero. The CAM blocks of these arrays produce a match compare result if the query input is equal to the data stored in the CAM cells in the CAM blocks, and a mismatch result if otherwise, whereas the TCAM cells can store three states: logic one, logic zero, and don't care. TCAM blocks of these TCAM cells produce a local match compare result if the query input is equal to the data stored in the TCAM cells in the TCAM blocks, the query input contains a don't care state, or the data stored is a don't care data. The TCAM cells produce a mismatch result otherwise. The TCAM cells are particularly useful in address translation systems that allow variable sized allocation units.

Typically, the current TCAM cells require a significantly large silicon area, which can result in consuming more power. One conventional technique to reduce the silicon area and power consumption uses NAND based compare circuits to reduce the TCAM cell size and power consumption. However, this technique fails to perform well at lower voltages, because the voltage at the gate of the TCAM cell is equal to VDD (supply voltage)–Vt (threshold voltage), and limits system performance.

Another conventional technique uses same bit lines that are used for read/write as well as search to reduce the number of total bit lines per TCAM cell in an effort to reduce the silicon area. This approach requires using PMOS transistors in the compare circuit, which generally reduces the speed of operation during a compare operation. In addition, this approach requires evaluating the search bit lines during write operation, which results in the dissipation of a large amount of power. In addition, this approach increases capacitance (parasitic effects between bit lines), which can result in considerably reducing the TCAM cell performance.

SUMMARY OF THE INVENTION

According to an aspect of the subject matter, there is provided a TCAM cell in which a pair of memory elements is connected using substantially vertical interconnections that are disposed in the active NMOS layer and the active PMOS layer. Further, the pair of memory elements is connected using substantially horizontal interconnections that are disposed in metal and poly layers. Furthermore, the TCAM cell includes a pair of compare circuits that include a pair of NMOS transistors which are connected using substantially vertical interconnections that are disposed in an active NMOS layer to provide a lower aspect ratio TCAM cell.

BRIEF DESCRIPTION OF THE DRAWINGS

FIG. 5 is a layout diagram showing inter-connectivity between the active and poly layers according to an embodiment of the present invention, as shown in FIG. 4. FIG. 6 is a layout diagram similar to the one shown in FIG. 5, but in addition to active and poly layers it depicts the metal 1 layer. FIG. 7 is a layout diagram similar to the one shown in FIGS. 5 and 6, but in addition to the active, poly and metal 1 layers it depicts the metal 2 layer. FIG. 8 is a layout diagram similar to the one shown in FIGS. 6 and 7, but in addition to the active, poly, metal 1 and metal 2 layer, it depicts the metal 3 layer.

DETAILED DESCRIPTION OF THE INVENTION

In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 1:
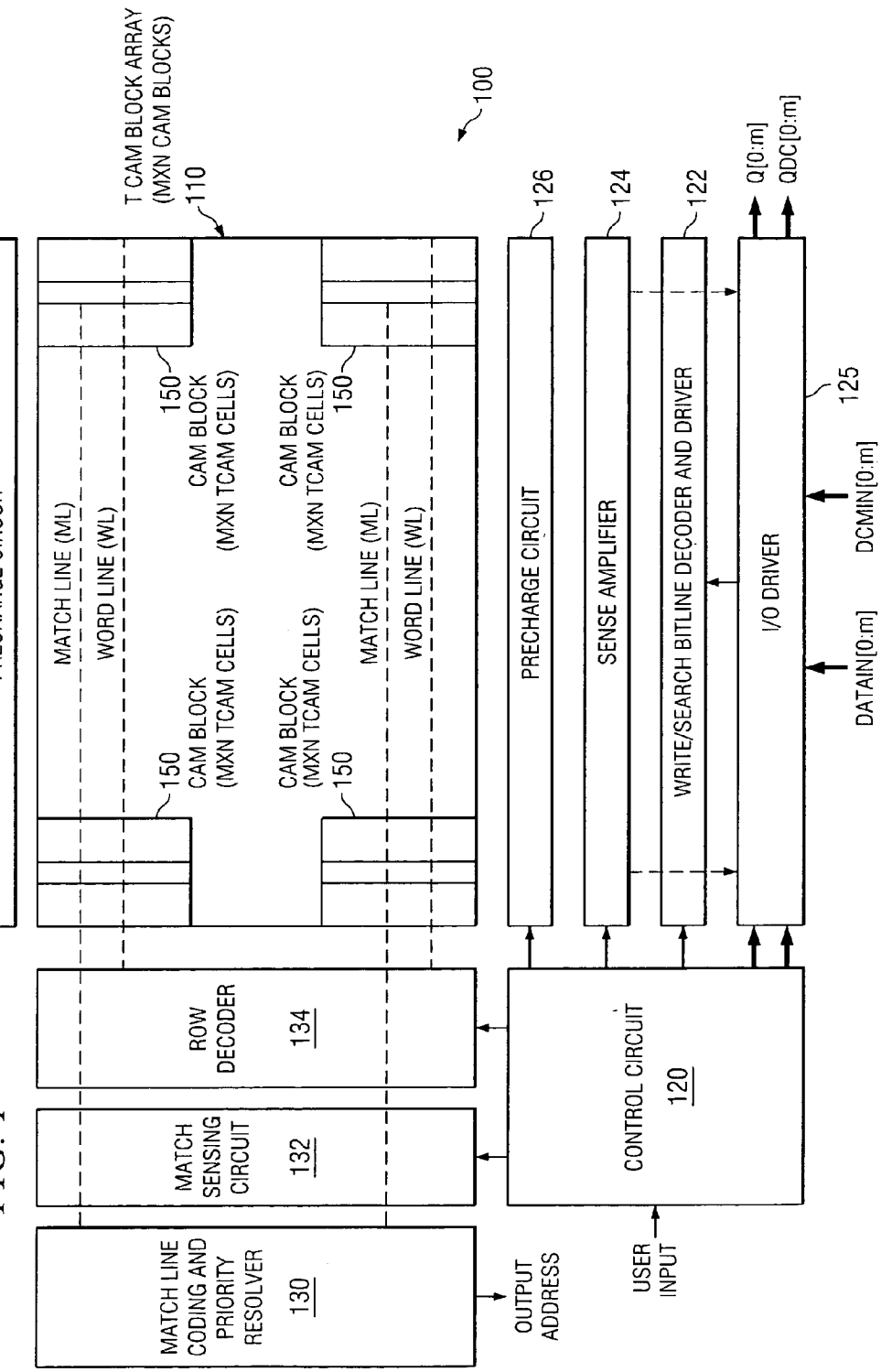
FIG. 1 is a block diagram of a CAM system according to an embodiment of the present invention.

Referring now to FIG. 1, there is illustrated an embodiment of a CAM system 100 according to the present invention. The CAM system 100 includes a TCAM block array 110, a control circuit 120, write/search bitline decoder and driver circuits 122, sense amplifiers 124, read/write bitline and search bitline precharge circuits 126 and input/output (I/O) drivers 125. As shown in FIG. 1, the CAM system 100 further includes a match line coding and priority resolver 130, a match sensing circuit 132, and a row decoder 134

Further as shown in FIG. 1, the TCAM block array 110 has multiple CAM blocks 150 which are organized into at least one rectangular array which has a plurality of rows, and each row has a plurality of CAM blocks, and each CAM block 150 has a plurality of TCAM cells. In some embodiments, the TCAM block array 110 is arranged to include (M×N) CAM blocks which has M number of rows and N number of columns. As shown in FIG. 1, each of the plurality of CAM blocks has an associated match line (ML) and a word line (WL). A control circuit 120 receives user input and is in communication with the precharge circuit 126, sense amplifier 124, write/search bitline decoder and driver 122, and I/O driver 125. An I/O driver 125 is in communication with the control circuit 120 and the write/search bitline decoder and driver 122. The I/O driver 125 receives the external input signals DATAIN [0:m] and DCMIN [0:m] and sends output signals Q [0:m] and QDC [0:m] where m is the number of data bits.

Figure 2:
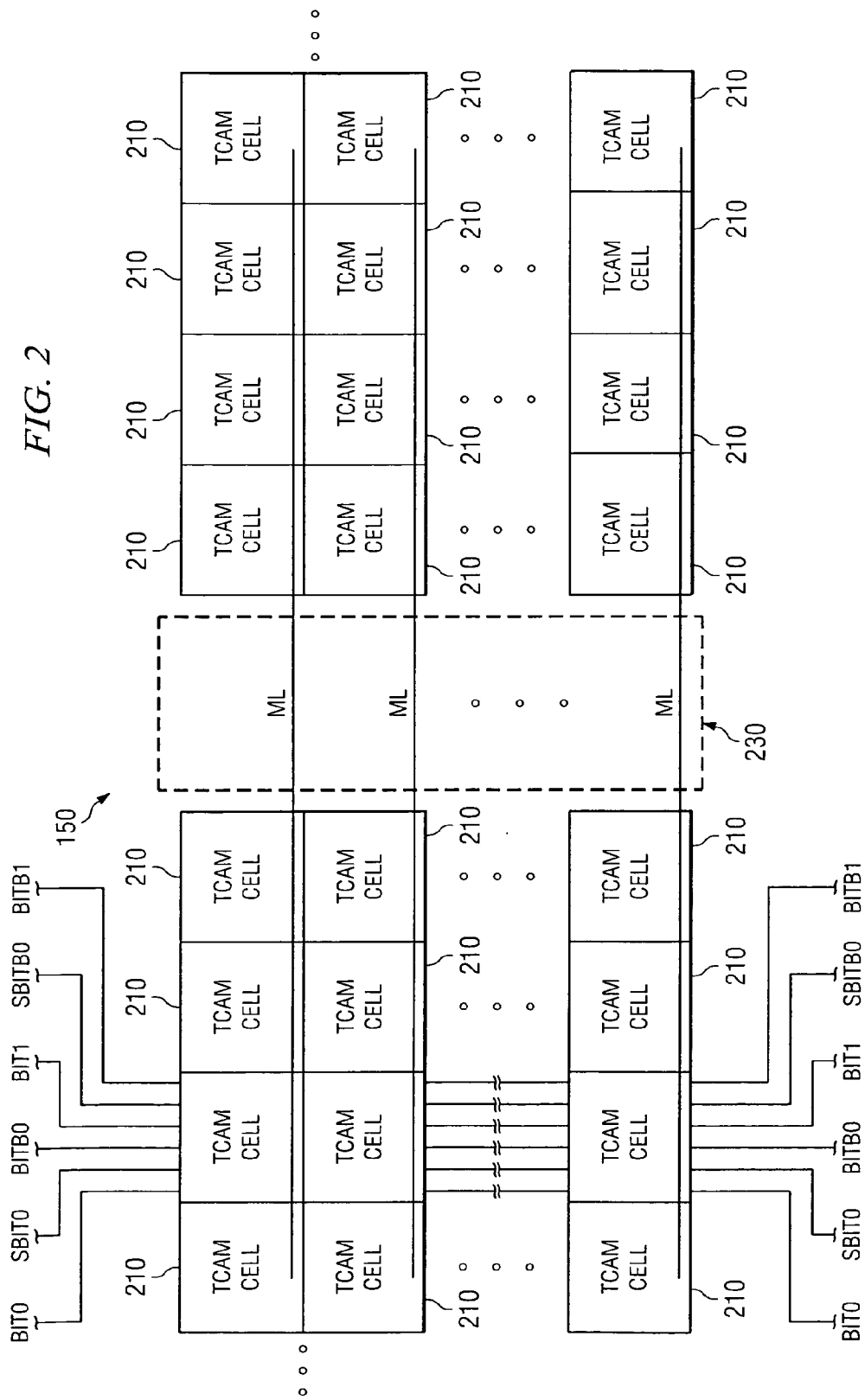
FIG. 2 is a block diagram of a CAM block and its associated conversion circuitry according to an embodiment of the present invention, such as those shown in FIG. 1.

Referring now to FIG. 2, there is illustrated an embodiment of a CAM block 150 (as shown in FIG. 1). As shown in FIG. 2, each CAM block 150 includes a plurality of TCAM cells which are arranged into a rectangular array such that each TCAM cell 210 is associated with a row and a column in the CAM block 150. In some embodiments, each CAM block 150 includes (M×N) TCAM cells arranged in a rectangular array of M number of rows and N number of columns. Each TCAM cell in the CAM block 150 has a pair of read/write bit lines BIT0 and BIT1, a pair of read/write bit complement lines BITB0 and BITB1, and a pair of search bit lines SBIT0 and SBITB0 which are connected to each of the associated plurality of CAM cells 210. This is illustrated as an example in one of the TCAM cells, and can be envisioned as present in each of the TCAM cells.

Further as shown in FIG. 2, the plurality of TCAM cells 210 in each CAM block 150 are connected to an associated match line In some embodiments, each of the multiple CAM blocks 150 includes a local to global conversion circuit 230, which converts the local match signal to a global match signal associated with each row of TCAM cells. In these embodiments, the global match signals are sensed using a match sensing circuit 132 (shown in FIG. 1). In these embodiments, each of the plurality of TCAM cells 210 includes a pair of memory elements for storing a data bit and a pair of associated compare circuits for comparing the stored data bit with a received compare data bit.

Figure 3:
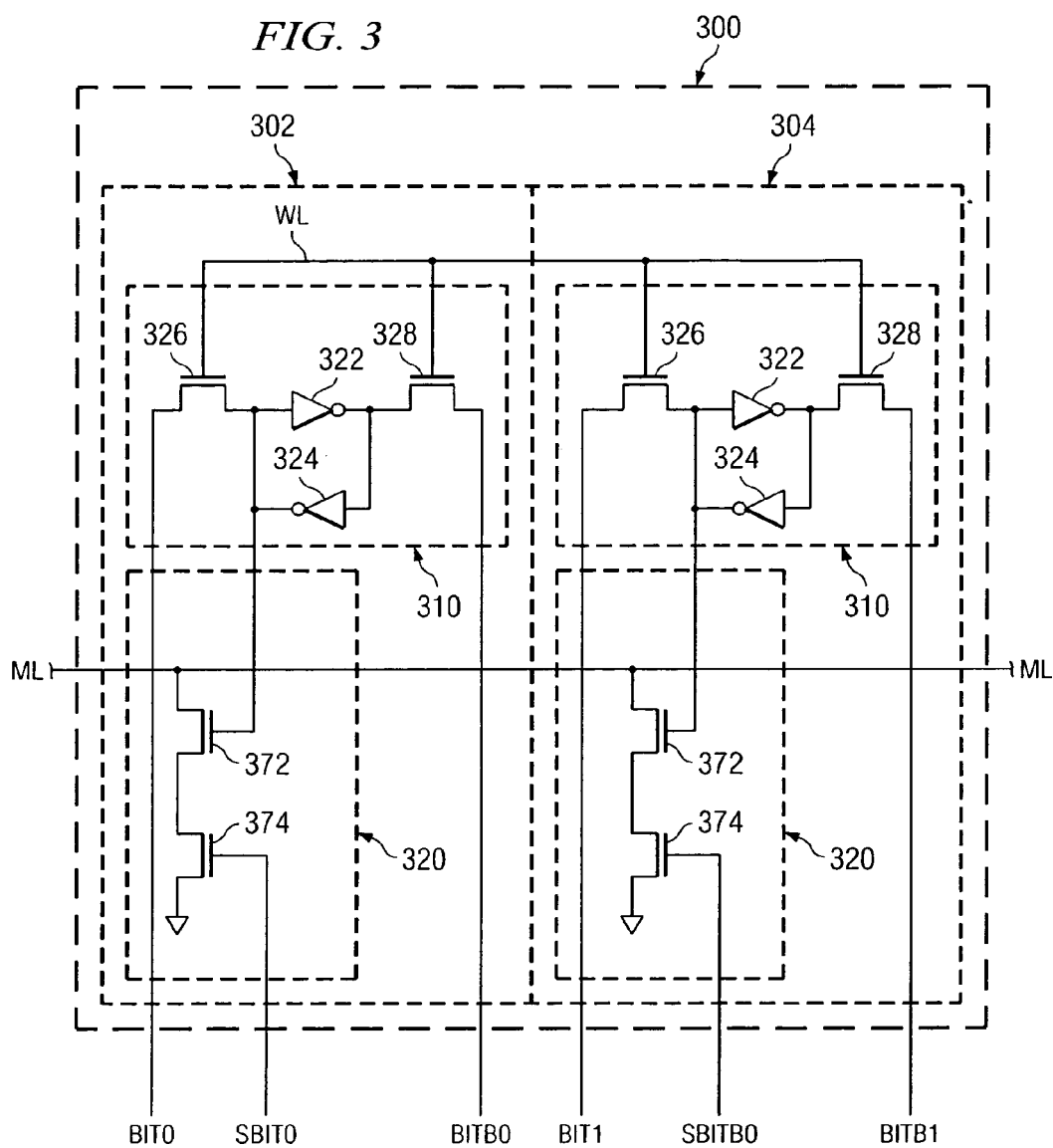
FIG. 3 is a schematic diagram showing the left and right circuit portions of a TCAM cell as shown in FIGS. 1 and 2.

Referring now to FIG. 3, there is illustrated an embodiment of a circuit diagram of the left and right circuit portions of a TCAM cell 300 used in the CAM block 150 (shown in FIG. 1) of the TCAM block array 110 (shown in FIG. 1). As shown in FIG. 3, the TCAM cell 300 includes a pair of memory elements 310 and their associated NMOS based pair of compare circuits 320 in each of the left and right circuit portions 302 and 304. The present invention is not limited to TCAM cell based CAM block arrays and can be based on any other type of CAM cell, such as binary CAM cells. In these embodiments, the CAM cell stores one data bit, whereas a TCAM cell 300, such as the one shown in FIG. 3, includes two memory elements, such as SRAM cells and can store two data bits. The TCAM cells have the capability to store and search "don't cares" as well.

As shown in FIG. 3 each of the left and right circuit portions 302 and 304 of the TCAM cell 300 includes two back-to-back inverters 322 and 324. Also as shown in FIG. 3, the back-to-back inverters 322 and 324 are connected between a first access transistor 326 and a second access transistor 328. In the embodiment shown in FIG. 3, the first access transistor 326 and the second access transistor 328 are NMOS based transistors. These back-to-back inverters 322 and 324 can be accessed via gates of the pair of NMOS transistors 326 and 328 and word line WL. Each of the left and right circuit portions of the TCAM cell 300 includes a match line ML, and a word line WL. Further included is a separate pair of read/write bit lines and their corresponding complements, referenced as BIT0, BITB0 for the left half circuit portion and BIT1, BITB1 for the right half circuit portion. Also, these back-to-back inverters 322 and 324 can be accessed via drains of the pair of access NMOS transistors 326 and 328 and the corresponding read/write bit and read/write bit complement lines. The gate of compare transistor 374 of each of the left and right circuit portions is respectively connected to the search bit line SBIT0 and the search bit complement line SBITB0.

Further, as shown in FIG. 3, the NMOS based pair of compare circuits 320 includes a first compare NMOS transistor 372 and a second compare NMOS transistor 374. As shown, the compare transistors 372 of the left and right circuit portions are connected to match line ML. In case of a mismatch, the match line will be pulled low. Also, it can be seen in FIG. 3, that the NMOS based pair of compare circuits 320 is connected to the search bit line SBIT0 and search bit complement line SBITB0. Search bit line SBIT0 is connected to the gate of compare transistor 374 of the left circuit portion 302 of the TCAM cell 300, whereas search bit complement line SBITB0 is connected to the gate of compare transistor 374 of the right circuit portion 304 of the TCAM cell 300.

Figure 4:
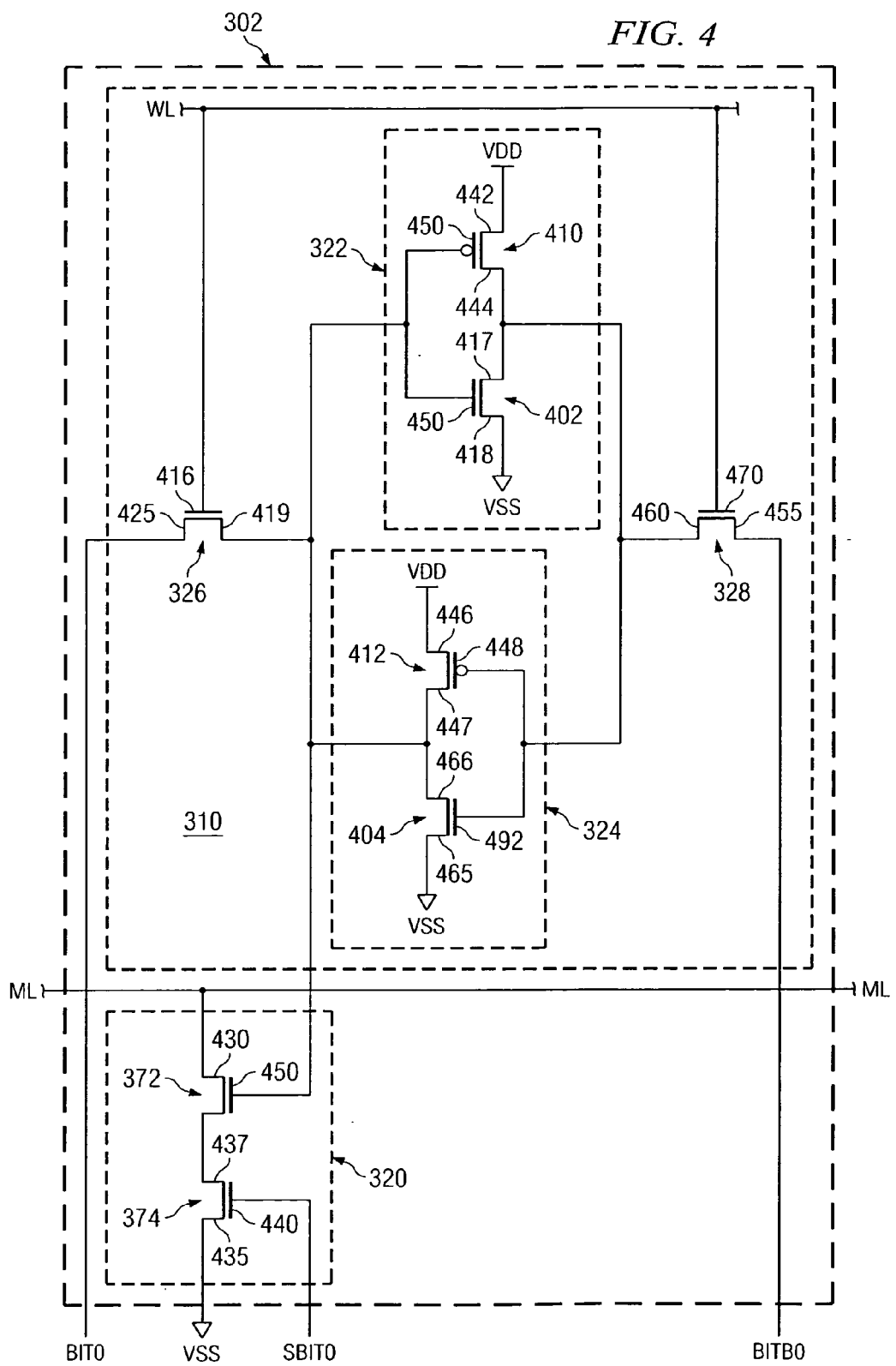
FIG. 4 is a schematic diagram showing the left circuit portion of a TCAM cell as shown in FIG. 3.

Referring now to FIG. 4 there is illustrated a circuit schematic of the left circuit portion 302 of a TCAM cell 300 (as shown in FIG. 3). The left circuit portion 302 includes memory element 310, and compare circuit 320. Associated with the memory element 310, are back-to-back inverters 322 and 324 (as shown in FIG. 3), first access transistor 326, and a second access transistor 328. Each of the back-to-back inverters further includes a load PMOS transistor and a driver NMOS transistor, denoted as first and second load PMOS transistors 410 and 412, and first and second driver NMOS transistors 402 and 404.

Also as shown in FIG. 4, the left circuit portion 302 of the TCAM cell 300 includes the first compare NMOS transistor 372 and the second compare NMOS transistor 374 associated with the one of the pair of compare circuits 320. Further as shown, the left circuit portions 302 of the TCAM cell 300 includes match line ML, word line WL, bit line BIT0, bit complement line BITB0, and search bit line SBIT0. It can be envisioned that the right circuit portion reflects the same circuit elements and connectivity as shown in the left circuit portion.

As shown in FIG. 4, the first access transistor 326 includes a gate 416, a source 419, and a drain 425 and the second access transistor 328 includes a gate 470, a source 460, and a drain 455. The gates 416 and 470 of the first and second access transistors 326 and 328 are connected to word line WL. The first driver NMOS transistor 402 includes a gate 450, a source 418, and a drain 419, and the second driver NMOS transistor 404 includes a gate 492, a source 465, and a drain 466. As shown, common terminal 419, connected to terminal 466 serves as the source of first access transistor 326, and the drain of driver NMOS transistor 404. Similarly, common terminal 460, connected to terminal 417 serves as the source of the second access transistor 328, and the drain of driver NMOS transistor 402. Further, common gate 492 of second NMOS driver transistor 404 is shared with the gate of second load PMOS transistor 412.

Further as shown in FIG. 4, the first compare NMOS transistor 372 includes a gate 450, a source 437, and a drain 430 and the second compare NMOS transistor 374 includes a gate 440, a source 435, and a drain 437. The drain 430 of first compare NMOS transistor 372 is connected to the match line ML and the gate 450 of first compare NMOS transistor 372 is connected to the source 419 of the first access transistor 326. Further as shown in FIG. 4, is the first load PMOS transistor 410 which includes a gate 450, a source 442, and a drain 444. The second load PMOS transistor 412 includes a gate 448, a source 446, and a drain 447.

As shown in FIG. 4, the source 435 of the second compare NMOS transistor 374 is connected to VSS which can be shared with a substantially adjacent TCAM cell. The gate 440 of the second compare NMOS transistor 374 is connected to the search bit line SBIT0. The terminal 437 is connected to drain of second compare transistor 374 and source of first compare NMOS transistor 372. The gate 450 of first compare NMOS transistor 372 is connected to the gate of first driver NMOS transistor 402 and the gate of first load PMOS transistor 410. Furthermore, gate terminal 450 is also connected to drain 466 of second driver NMOS transistor 404 and to the drain 447 of the second load PMOS transistor 412.

Figure 5:
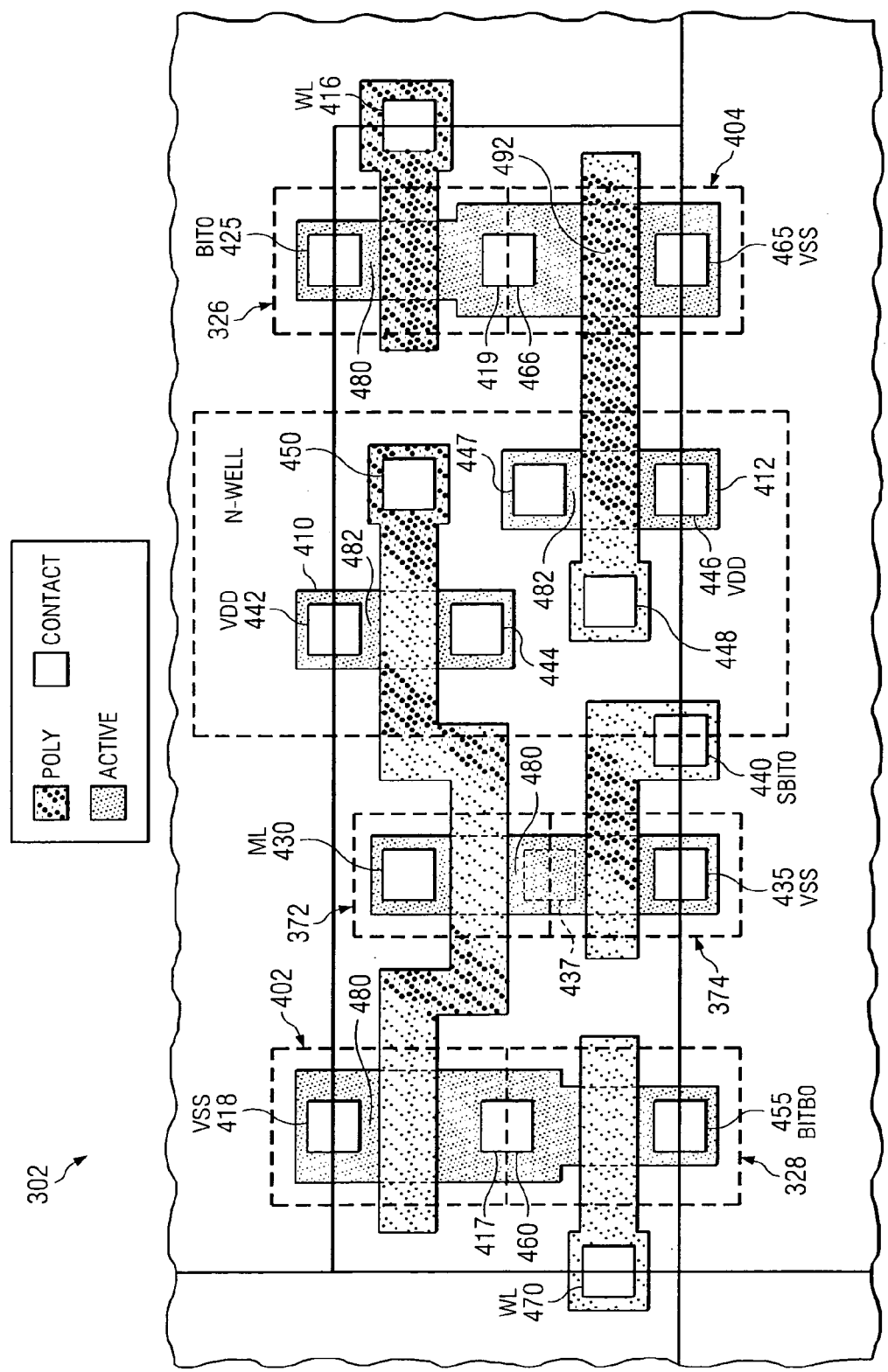
FIGS. 5–8 are layout diagrams showing sequential inter-connectivity between active, poly, and metal layers according to an embodiment of the present invention as in FIG. 4.

FIGS. 5 to 8 represent the layout figures corresponding to the circuit diagram as in FIG. 4 showing the sequential addition of various active, poly, and metal layers. Although the figures viewed individually, represent a particular sequential layer showing a particular aspect of the layout, FIGS. 5 to 8 have the same transistor placements and terminal placements, and a mention at the beginning of the description and orientation of transistors in FIG. 5 is understood to be applicable to each of the figures in this group of FIGS. 5 to 8.

Referring now to the group of FIGS. 5 to 8, there is illustrated several layout representations of the left circuit portion 302, of a TCAM cell 300 as shown in FIG. 4. The layout diagrams illustrate an embodiment of an inter-connectivity of the left circuit portion 302, which includes memory element 310 and its associated compare circuit 320, the read/write bit line BIT0 and its associated read/write bit complement line BITB0, and the search bit line SBIT0 (as shown in FIG. 4). In addition, the above mentioned circuit elements are selectively located in an active NMOS layer 480, an active PMOS layer 482, and the contacts are shown for inter-connectivity of transistor terminals. Further, the gate terminals of all transistors are shown in a poly layer (POLY) of the TCAM cell 300.

It can be envisioned that the inter-connectivity shown in FIGS. 5 to 8, similarly extends to the right circuit portion 304 of the TCAM cell 300 that includes the other one of the pair of memory elements 310 and the associated other one of the compare circuits 320 (shown in FIG. 3). Also, it can be envisioned that the right circuit portion is the reflected portion of the left circuit portion and contains similar circuitry as shown in FIG. 4. Furthermore, the inter-connectivity of the left and right circuit portions of the TCAM cell 300 extends to each TCAM cell in the TCAM block 150 (shown in FIG. 2).

Now referring to FIG. 5, there is illustrated a layout of the left circuit portion 302, (as shown in FIG. 4) of the TCAM cell 300 (as shown in FIG. 3). As shown in FIG. 5, first and second load PMOS transistors 410 and 412 are disposed in active PMOS layer 482 within the N-well and the first and second driver transistors 402 and 404 are disposed in active NMOS layer 480. It can be seen that the first driver NMOS transistor 402 and the access transistor 328 are connected using interconnections that are substantially vertical in the active NMOS layer 480. Also, the second driver NMOS transistor 404 and the access transistor 326 are connected using interconnections that are substantially vertical in the active NMOS layer 480. As can be seen, first and second driver NMOS transistors 402 and 404, first and second access transistors 326 and 328, and the associated read/write bit line and its complement BIT0 and BITB0 are connected using interconnections that are substantially horizontal in metal 1 layer (M1) (FIGS. 6 to 8) and poly layer (POLY) (FIGS. 5 to 8).

Figure 7:
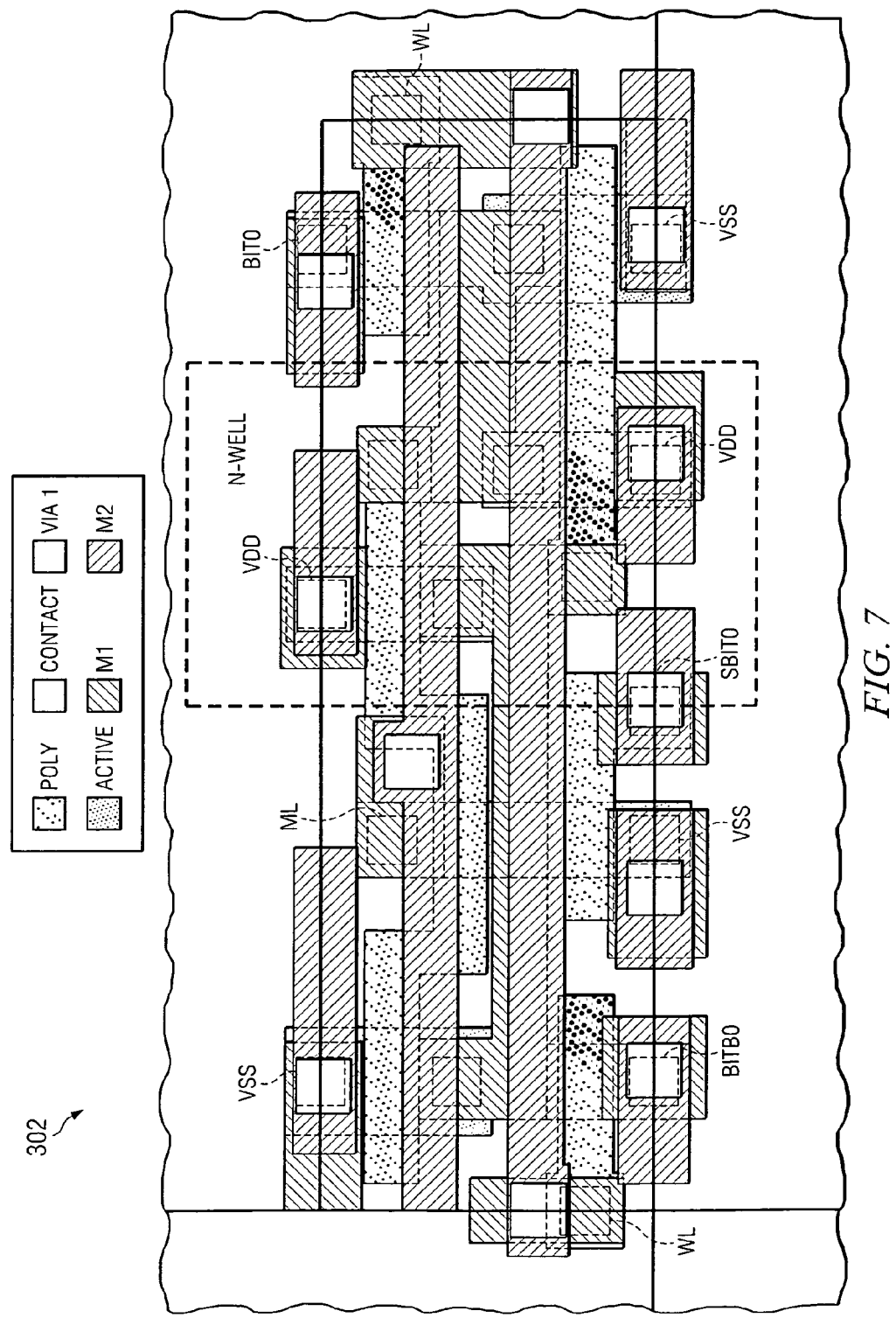
Figure 8:
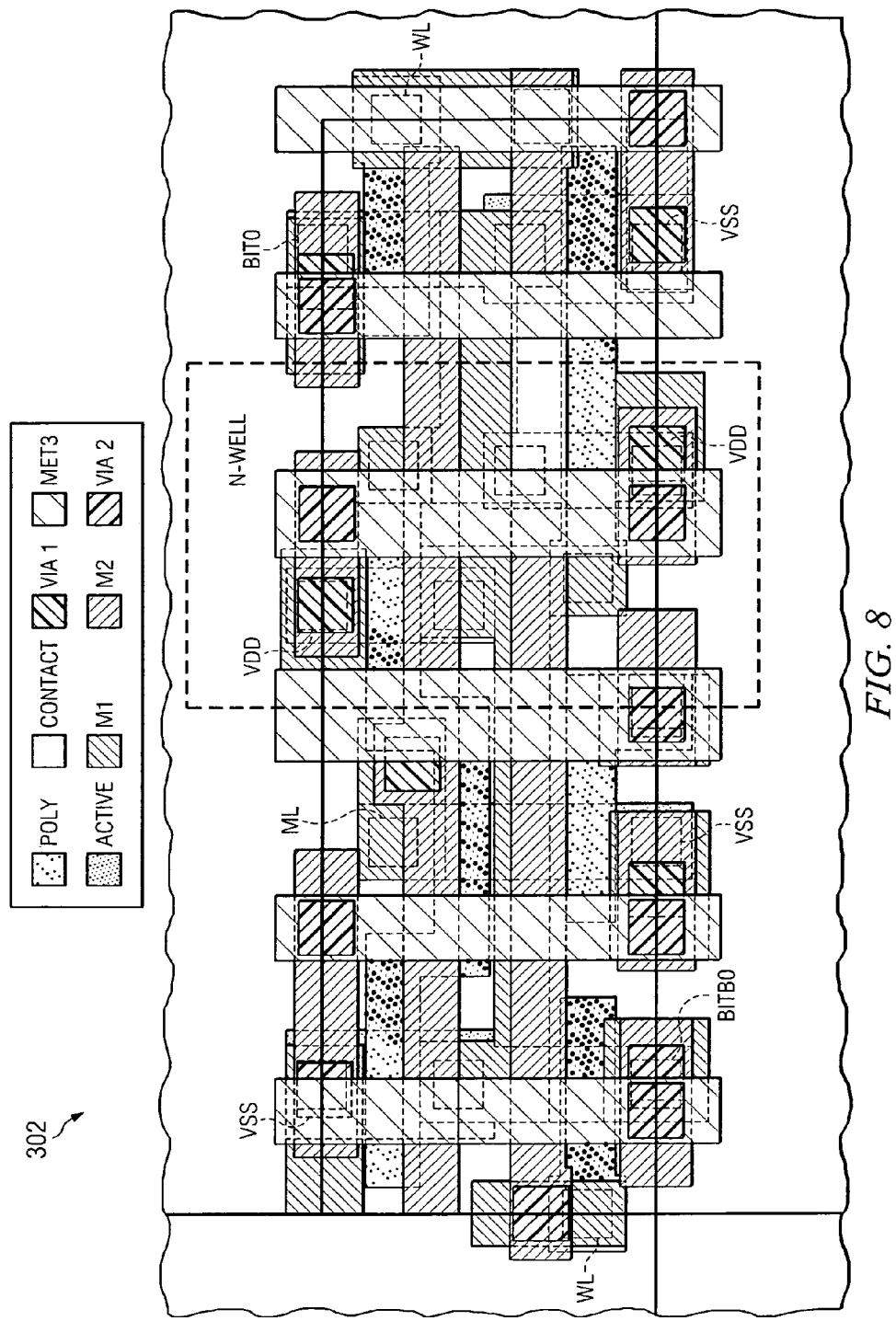

In addition, it can be seen in FIG. 5 that compare transistors 372 and 374 are disposed in vertical NMOS layers and the drain 430 of the NMOS compare transistor 372 is connected to the match line ML using metal 1 layer M1 (as shown in FIG. 7). Also, it can be envisioned that the metal 1 layer M1 can be brought up to another metal 2 layer (M2) (shown in FIG. 7). It can be seen that the example inter-connectivity of one of the pair of memory elements 310 and the associated one of the pair of compare circuits 320 (shown in FIG. 3) and the match line ML as shown in FIG. 4 facilitates sharing of terminals located at boundaries of adjacent cells and use of shorter interconnections resulting in reduced silicon area.

In some embodiments, the driver NMOS transistors 402 and 404 associated with the back-to-back inverters 322 and 324 and the associated first access transistor 326 and the second access transistor 328 are connected such that the interconnections are aligned substantially vertically in the active NMOS layer 480. The source terminals 442 and 446, and the drain terminals 444 and 447 associated with each of the first and second load PMOS transistors 410 and 412 respectively, are connected such that their interconnections align substantially vertically in the active PMOS layer 482. The gate 450 of the first load PMOS transistor 410 is connected to the associated first driver NMOS transistor 402 and the first compare NMOS transistor 372 such that the interconnections are disposed to align substantially horizontally in the poly layer POLY. As can be seen, the common, shared gate terminal 450 is represented as a U-shaped POLY, which connects to gates of transistors 402, 372 and 410. In these embodiments, the gate 440 of the second compare NMOS transistor 374 is connected to the search bit line SBIT0 such that the interconnections align substantially horizontally in the poly layer POLY.

Also in these embodiments, the drain 425 of the first access transistor 326 and the drain of the 455 second access transistor 328 are shared with associated pairs of memory elements of TCAM cells located substantially adjacent to the portion of the TCAM cell 300. Further, the sources 418 and 465 of the first and second driver NMOS transistors 402 and 404 respectively are connected to the VSS terminals, which are shared with associated pairs of memory elements of TCAM cells located substantially adjacent to the portion of the TCAM cell 300. Furthermore, the gate 416 of the first access transistor 326 and the gate 470 of the second access transistor 328 are shared with associated pairs of memory elements of TCAM cells located substantially adjacent to the portion of the TCAM cell 300. In addition, the sources 442 and 446 of the first and second load PMOS transistors 410 and 412 are connected to VDD and are also shared with another substantially adjacent TCAM cell. It can be seen that the gate 448 of the second PMOS transistor 412 is a common terminal to the shared gate 492 of its associated second driver NMOS transistor 404.

It can be envisioned, that the gates 416 and 470 of access transistors 326 and 328 respectively are connected to horizontal running word lines WL in metal 2 layer M2 through a VIA1 layer and the match lines ML running in metal 2 layer M2 in horizontal direction connects to the drain 430 of the first compare NMOS transistor 372, through a VIA1 layer. As will be understood by those skilled in the art, the read/write bit lines and search bit lines can run vertically in another metal 3 layer (M3), and in some other embodiments, metal 2 layer M2 and metal 3 layer M3 can be interchanged. For example, the horizontal running word lines WL and match lines ML can be run in metal 3 layer M3, and read/write bit lines and search bit lines in metal 2 layer M2.

It must be noted that the circuit diagram of FIG. 4 viewed along with the layout diagrams of FIGS. 5–8 provide the visual detail necessary to understand the substantially vertical and horizontal interconnectivity of the memory and compare circuits, especially where there is an overlapping of several active, poly, and metal layers.

It can be envisioned that this circuit portion is replicated to facilitate sharing of adjacent cells using shorter interconnections resulting in reduced silicon area.

Further, the shorter interconnections described above results in using less metal which reduces capacitance effects as well as provide space savings which may be utilized for other interconnect routing.

Figure 6:
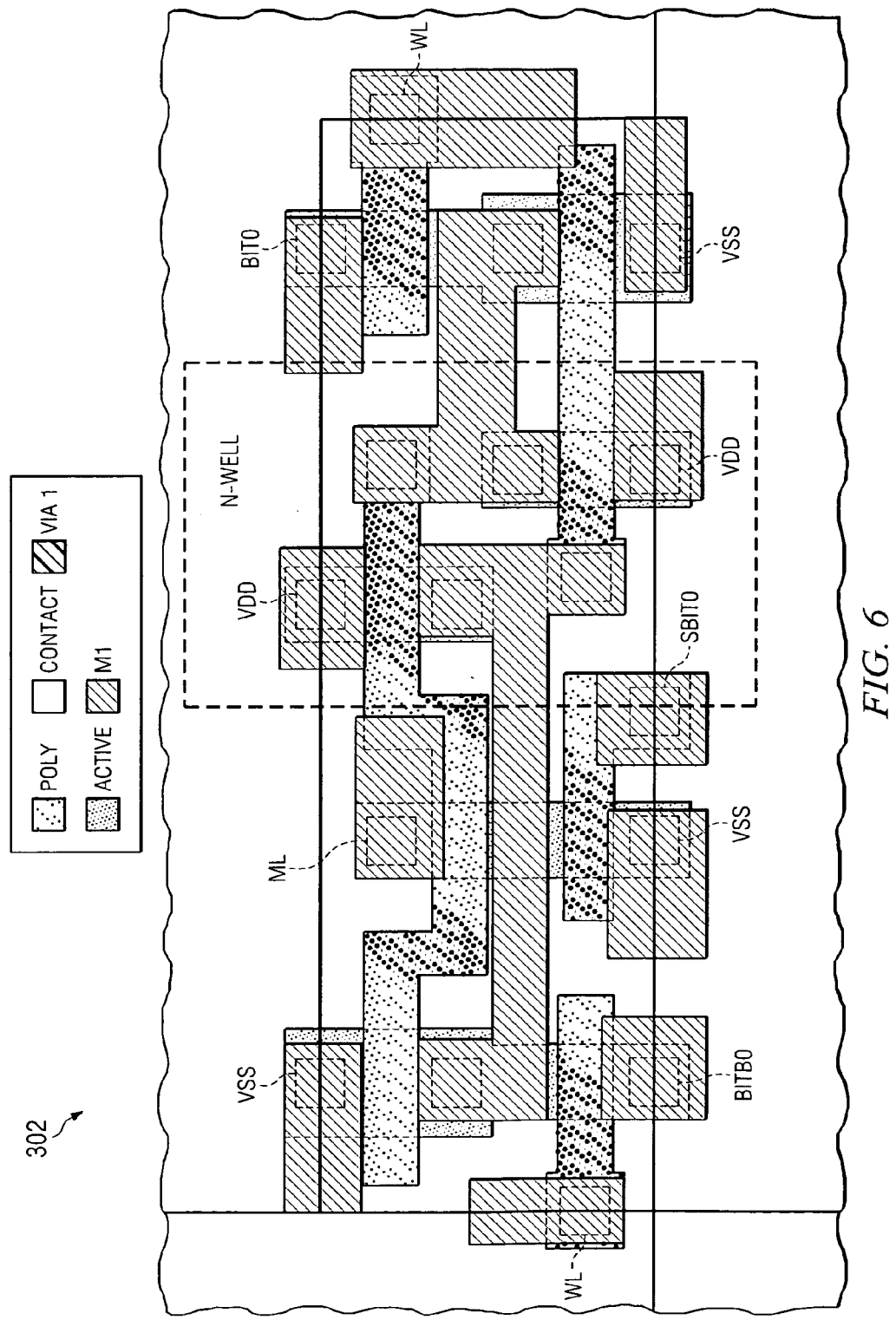

Referring now to FIG. 6, there is illustrated a layout of the left circuit portion 302, (as shown in FIG. 5) of the TCAM cell 300 (as shown in FIG. 3.) As can be readily seen, FIG. 6 is a layout diagram similar to the one shown in FIG. 5, but in addition to the active NMOS layer 480, active PMOS layer 482, and poly layer POLY of FIG. 5, there is depicted a metal 1 layer M1 according to an embodiment of the invention as shown in FIGS. 4 and 5. It will be understood that all transistor names and terminal connection placements and inter-connectivity are the same as shown in FIG. 5. For clarity, only the additional layers are shown. Also, many interconnections not apparent in FIG. 5 are readily seen here. For example, the connectivity of the common gate terminal 450, and inter-connectivity of terminals 444 and 448, and inter-connectivity of terminals 450 connecting terminal 447 and terminal 466 can be seen.

Further in these embodiments, the drain 444 of the first load PMOS transistor 410 associated with one of the pair of back-to-back inverters is connected to the drain 417 of the first driver NMOS transistor 402 and the source 460 of the second access transistor 328 such that the interconnections are substantially horizontal in metal 1 layer M1. Furthermore, the drain 444 of the first load PMOS transistor 410 associated with one of the back-to-back inverters of the pair of memory elements 310 is connected to the gate 448 of the second load PMOS transistor 412 associated with the other back-to-back inverters via the metal 1 layer M1 such that the terminals 444 and 448 are substantially in the vicinity of each other to facilitate a shorter connection to reduce silicon area. In addition, the drain 447 of the second load PMOS transistor 412 associated with the other one of the pair of back-to-back inverters is connected to the drain 466 of the second driver NMOS transistor 404 which is further connected to the source 419 of the first access transistor 326 via the metal 1 layer M1, such that the interconnections are substantially horizontal. Also, the drain 447 of the second load PMOS transistor 412 is connected to the gate 450 of the first load PMOS transistor 410 in metal 1 layer M1 such that the terminals 450 and 447 are substantially in the vicinity of each other to facilitate a shorter connection to reduce silicon area.

Referring now to FIG. 7, there is depicted metal 2 layer M2 in addition to the active NMOS layer 480, active PMOS layer 482, poly layer POLY, and metal 1 layer M1 of FIG. 7. It will be understood that all transistor names and terminal connection placements and inter-connectivity are the same as shown in FIG. 5. For clarity, only the active PMOS layer 482, active NMOS layer 480, metal 1 layer M1, metal 2 layer M2, signals VSS and VDD, bit line BIT0, bit complement line BITB0, search bit SBIT0, match line ML and word line WL are shown.

In one embodiment, metal 2 layer M2 can be used for match line ML and word line WL. In another embodiment, metal 3 layer (M3) can be used for the BIT0, BITB0, SBIT0, VSS and VDD Referring now to FIG. 8, there is depicted metal 3 layer M3 in addition to the active NMOS 480, active PMOS 482, poly layer POLY, metal 1 layer M1 and metal 2 layer M2 of FIG. 6. It will be understood that all transistor names, terminal connection placements and inter-connectivity are the same as shown in FIG. 5. For clarity, only the active PMOS layer 482, active NMOS layer 480, metal 1 layer M1, metal 2 layer M2, metal 3 layer M3, signals VSS, VDD, bit line BIT0, bit complement line BITB0, search bit SBIT0, match line ML and word line WL are shown.

Although FIGS. 5–8 are illustrative of only one embodiment, it can be envisioned that metal 2 layer and metal 3 layers can be interchanged in other embodiments and that the metal layers can be additional and different.

The above-described methods and apparatus provide various schemes to enhance the performance and reduce the silicon area in TCAM cells. It is expected that the above-described methods and apparatus can also be implemented for binary CAM cells. While the present subject matter has been described with reference to static memory elements, it is anticipated that dynamic memory elements can also be used to store the data bits.

The proposed technique increases performance and reduces silicon area and power consumption in a TCAM cell while controlling leakage effects. Further, the proposed technique for a TCAM cell consists of 2 units having a short aspect ratio. This is achieved by generally keeping the X dimension larger compared to the Y dimension, where X and Y are defined as the horizontal width and vertical height respectively. The short aspect ratio also yields a higher performance. For example, the above technique results in an aspect ratio of about 6.69 (X=5.76u, Y=0.86u) for a 90 nanometer technology. It can be envisioned that this aspect ratio is technology dependent and changes as dimensions get smaller.

The short fat architecture described-above provides smaller bit line lengths which are also spaced apart and shielded, which in turn lowers coupling capacitance and parasitic effects between bit lines to enhance performance and reduce power consumption The number of TCAM cells connected to each of the match line is decided based on the performance and leakage effect on evaluated lines. Thus, a fully parallel search is enabled by this design. The above technique takes into account the tradeoff of the transistor sizes used in the TCAM cell to achieve a higher performance and a reduced silicon area. In addition, the compare circuit transistors (controlled by the search bit line and memory cell node) are ordered such that charge sharing between match line and the intermediate node between the series connected compare circuit transistors, does not happen on match lines that do not evaluate a mismatch (the precharged state is retained on the match line).

It is to be understood that the above description is intended to be illustrative, and not restrictive. Many other embodiments will be apparent to those of skill in the art upon reviewing the above description. The scope of the subject matter should, therefore, be determined with reference to the following claims, along with the full scope of equivalents to which such claims are entitled.

As shown herein, the present invention can be implemented in a number of different embodiments, including various methods, an apparatus, and a system. Other embodiments will be readily apparent to those of ordinary skill in the art. The elements, algorithms, and sequence of operations can all be varied to suit particular requirements.

FIGS. 1–8 are merely representational and are not drawn to scale. Certain proportions thereof may be exaggerated, while others may be minimized. FIGS. 1–8 illustrate various embodiments of the invention that can be understood and appropriately carried out by those of ordinary skill in the art.

It is emphasized that the Abstract is provided to comply with 37 C.F.R. § 1.72(b) requiring an Abstract that will allow the reader to quickly ascertain the nature and gist of the technical disclosure. It is submitted with the understanding that it will not be used to interpret or limit the scope or meaning of the claims.

In the foregoing detailed description of the embodiments of the invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of the embodiments of the invention, with each claim standing on its own as a separate preferred embodiment.

The above description is intended to be illustrative, and not restrictive. Many other embodiments will be apparent to those skilled in the art. The scope of the invention should therefore be determined by the appended claims, along with the full scope of equivalents to which such claims are entitled.

The invention claimed is:

1. A TCAM cell architecture comprising:
a read/write bit line and a read/write bit complement line;
a search bit line and a search bit complement line;
an active NMOS layer, an active PMOS layer, a poly layer, and metal layers;
a pair of memory elements connected to the associated read/write bit line and the read/write bit complement line for storing a data bit and a complement data bit; and
a pair of compare circuits connected to the associated pair of memory elements and the associated search bit line and the search bit complement line that compares the stored data bit and the stored complement data bit with a received compare data bit via the search bit line and the search bit complement line, respectively, and drives a mismatch signal onto an associated match line when the stored data bit is not equal to the compare data bit,
wherein each of the pair of memory elements are connected using substantially vertical interconnections that are disposed in the active NMOS layer and the active PMOS layer and further connected using substantially horizontal interconnections that are disposed in the metal layers, wherein the pair of memory elements and the associated read/write bit line and the read/write bit complement line are connected using substantially horizontal interconnections that are disposed in the poly layer and the metal layer, wherein each of the pair of compare circuits include a pair of NMOS transistors, and wherein the pair of NMOS transistors are connected using substantially vertical interconnections that are disposed in an active NMOS layer.

2. The TCAM cell architecture of claim 1, wherein each of the pair of compare circuits are connected to the pair of memory elements that compares the stored data bit and the stored complement data bit with a received compare data bit via the search bit line and the search bit complement line, respectively, and drives a mismatch signal onto the associated match line when the stored data bit is not equal to the compare data bit, and
wherein each compare circuit includes a serially connected first compare NMOS transistor and a second compare NMOS transistor disposed substantially vertically in the active NMOS layer and, wherein the drain of the first compare NMOS transistor is connected to the match line.

3. The TCAM cell architecture of claim 1, wherein the pair of memory elements is a pair of SRAM cells, wherein each SRAM cell includes a first inverter, a second inverter, a first access transistor, and a second access transistor, wherein the first inverter includes an associated first load PMOS transistor and first driver NMOS transistor, the second inverter includes an associated second load PMOS transistor and second driver NMOS transistor wherein each transistor has an associated gate, drain and source terminals,
wherein the driver NMOS transistors associated with the back-to-back inverters and the associated first access transistor and the second access transistor are connected using interconnections that align substantially vertically in the active NMOS layer,
wherein the source and the drain associated with each load PMOS transistor are connected such that interconnections align substantially vertically in the active PMOS layer, and
wherein the gate of the first load PMOS transistor is connected to its associated first driver NMOS transistor via the first compare NMOS transistor using interconnections that are disposed to align substantially horizontally in the poly layer.

4. The TCAM cell architecture of claim 3, wherein the first compare NMOS transistor and the second compare NMOS transistor includes a gate, a drain, and a source, and wherein the gate of the second compare NMOS transistor is connected to the search bit line such that interconnections align substantially horizontally in the poly layer.

5. The TCAM cell architecture of claim 3, wherein the drain of each of the first access transistor and the second access transistor is shared with a substantially adjacent TCAM cell, the source of each driver NMOS transistor is shared with a substantially adjacent TCAM cell, the gate of each of the first access transistor and the second access transistor is shared with a substantially adjacent TCAM cell,
  wherein the source of each of the load PMOS transistor is shared with a substantially adjacent TCAM cell, wherein each of the first compare NMOS transistor and the second compare NMOS transistor associated with the pair of compare circuits has a gate, a source, and a drain, and wherein the source and the gate of the second compare NMOS transistor is shared with a substantially adjacent TCAM cell.

6. The TCAM cell architecture of claim 3, wherein the drain of the first load PMOS transistor is connected to the drain of the associated first driver NMOS transistor, and to the source of the first access transistor such that the interconnections are substantially horizontal in the metal layers,
  wherein the drain of the first load PMOS transistor is connected to the gate of the second load PMOS transistor via a metal 1 layer,
  wherein the drain of the second load PMOS transistor is connected to the drain of the associated second driver NMOS transistor and to the source of the second access transistor via the metal 1 layer such that the interconnections are substantially horizontal, and
  wherein the drain of the second load PMOS transistor is connected to the gate of the first load PMOS transistor via the metal 1 layer.

7. A TCAM circuit, comprising:
  a read/write bit line and a read/write bit complement line;
  a search bit line and a search bit complement line; an active NMOS layer, an active PMOS layer, a poly layer, and metal layers; and
  a CAM block array including (M×N) CAM blocks arranged in M number of rows and N number of columns, wherein each CAM block comprising:
    (M×N) TCAM cells arranged in a rectangular array of M number of rows and N number columns, wherein the read/write line and the read/write bit complement line are connected between each TCAM cell in each CAM block, and wherein the search bit line and the search bit complement line is connected between each TCAM cell in each CAM block, wherein each TCAM cell comprising:
      a pair of memory elements connected to the associated read/write bit line and the read/write bit complement line for storing a data bit and a complement data bit; and
      a pair of compare circuits connected to the associated pair of memory elements and the associated search bit line and the search bit complement line that compares the stored data bit and the stored complement data bit with a received compare data bit via the search bit line and the search bit complement line, respectively, and drives a mismatch signal onto an associated match line when the stored data bit is not equal to the compare data bit,
      wherein each of the pair of memory elements are connected using substantially vertical interconnections disposed in the active NMOS layer and the active PMOS layer and further connected using substantially horizontal interconnections that are disposed in the metal layers, wherein the pair of memory elements and the associated read/write bit line and the read/write bit complement line are connected using substantially horizontal interconnections that are disposed in the poly layer and the metal layer, wherein each of the pair of compare circuits include a pair of NMOS transistors, and wherein the pair of NMOS transistors are connected using substantially vertical interconnections that are disposed in an active NMOS layer.

8. The circuit of claim 7, wherein each of the pair of compare circuits is connected to the pair of memory elements that compares the stored data bit and the stored complement data bit with a received compare data bit via the search bit line and the search bit complement line, respectively, and drives a mismatch signal onto an associated match line when the stored data bit is not equal to the compare data bit, and wherein each compare circuit includes a serially connected first compare NMOS transistor and a second compare NMOS transistor disposed substantially vertically in the active NMOS layer, wherein the drain of the first compare NMOS transistor is connected to the match line.

9. The circuit of claim 7, wherein the pair of memory elements is a pair of SRAM cells, wherein each SRAM cell includes a first inverter, a second inverter, a first access transistor, and a second access transistor, wherein the first inverter includes an associated first load PMOS transistor and first driver NMOS transistor, the second inverter includes an associated second load PMOS transistor and second driver NMOS transistor wherein each transistor has an associated gate, drain and source terminals,
  wherein the driver NMOS transistors associated with the back-to-back inverters and the associated first access transistor and the second access transistor are connected using interconnections that align substantially vertically in the active NMOS layer,
  wherein the source and the drain associated with each load PMOS transistor are connected such that interconnections align substantially vertically in the active PMOS layer, and
  wherein the gate of the first load PMOS transistor is connected to its associated first driver NMOS transistor via the first compare NMOS transistor using interconnections that are disposed to align substantially horizontally in the poly layer.

10. The circuit of claim 9, wherein the first compare NMOS transistor and the second compare NMOS transistor includes a gate, a drain, and a source, and wherein the gate of the second compare NMOS transistor is connected to the search bit line such that interconnections align substantially horizontally in the poly layer.

11. The circuit of claim 10, wherein the drain of each of the first access transistor and the second access transistor is shared with a substantially adjacent TCAM cell, the source of each driver NMOS transistor is shared with a substantially adjacent TCAM cell, the gate of each of the first access transistor and the second access transistor is shared with a substantially adjacent TCAM cell, wherein the source of each of the load PMOS transistor is shared with a substantially adjacent TCAM cell, wherein each of the first compare NMOS transistor and the second compare NMOS transistor associated with the pair of compare circuits has a gate, a source, and a drain, and wherein the source of the second compare NMOS transistor and the source of the second driver NMOS transistor are shared with a substantially adjacent TCAM cell.

12. The circuit of claim 9 wherein the drain of the first load PMOS transistor is connected to the drain of the associated first driver NMOS transistor, and to the source of the first access transistor such that the interconnections are substantially horizontal in the metal layers, wherein the drain of the first load PMOS transistor is connected to the gate of the second load PMOS transistor via a metal 1 layer, wherein the drain of the second load PMOS transistor is connected to the drain of the associated second driver NMOS transistor and to the source of the second access transistor via the metal 1 layer such that the interconnections are substantially horizontal, and wherein the drain of the second load PMOS transistor is connected to the gate of the first load PMOS transistor via the metal 1 layer.

* * * * *